US012131966B2

(12) United States Patent
Ito et al.

(10) Patent No.: US 12,131,966 B2
(45) Date of Patent: Oct. 29, 2024

(54) SEMICONDUCTOR WAFER AND METHOD OF MANUFACTURING SEMICONDUCTOR APPARATUS

(71) Applicants: KABUSHIKI KAISHA TOSHIBA, Tokyo (JP); Kioxia Corporation, Tokyo (JP)

(72) Inventors: Fuyuma Ito, Yokkaichi (JP); Yasuhito Yoshimizu, Yokkaichi (JP); Nobuhito Kuge, Yokkaichi (JP); Yui Kagi, Yokkaichi (JP); Susumu Obata, Yokohama (JP); Keiichiro Matsuo, Yokohama (JP); Mitsuo Sano, Kamakura (JP)

(73) Assignees: KABUSHIKI KAISHA TOSHIBA, Tokyo (JP); Kioxia Corporation, Tokyo (JP)

( * ) Notice: Subject to any disclaimer, the term of this patent is extended or adjusted under 35 U.S.C. 154(b) by 474 days.

(21) Appl. No.: 17/467,839

(22) Filed: Sep. 7, 2021

(65) Prior Publication Data

US 2021/0407867 A1 Dec. 30, 2021

Related U.S. Application Data

(63) Continuation of application No. PCT/JP2020/010406, filed on Mar. 10, 2020.

(30) Foreign Application Priority Data

Mar. 20, 2019 (JP) ................................ 2019-052867

(51) Int. Cl.

*H01L 21/66* (2006.01)
*C30B 25/18* (2006.01)
(Continued)

(52) U.S. Cl.

CPC ............ *H01L 22/30* (2013.01); *C30B 25/186* (2013.01); *H01L 21/02002* (2013.01);
(Continued)

(58) Field of Classification Search

CPC ......... H01L 28/82; H01L 28/84; H01L 28/91; H01L 22/30; H01L 21/02002;
(Continued)

(56) References Cited

U.S. PATENT DOCUMENTS

2001/0048142 A1 12/2001 Urakami et al.
2005/0191822 A1 9/2005 Liu
(Continued)

FOREIGN PATENT DOCUMENTS

JP 59-28368 A 2/1984
JP 10-64776 A 3/1998
(Continued)

OTHER PUBLICATIONS

International Search Report issued Apr. 14, 2020 in PCT/JP2020/010406, filed on Mar. 10, 2020, 3 pages.

*Primary Examiner* — Jose R Diaz
(74) *Attorney, Agent, or Firm* — Oblon, McClelland, Maier & Neustadt, L.L.P.

(57) ABSTRACT

A semiconductor wafer includes a surface having at least one recess including an inner wall surface. The inner wall surface is exposed.

11 Claims, 13 Drawing Sheets

10a
11
4b
14
14a
11a
1
Z
X

(51) Int. Cl.
*H01L 21/02* (2006.01)
*H10B 43/27* (2023.01)

(52) U.S. Cl.
CPC ........ *H01L 21/02005* (2013.01); *H01L 22/34* (2013.01); *H10B 43/27* (2023.02)

(58) Field of Classification Search
CPC .. H10B 12/038; H10B 12/0387; H10B 12/37; C30B 25/186
See application file for complete search history.

(56) References Cited

U.S. PATENT DOCUMENTS

| | | | |
|---|---|---|---|
| 2006/0183055 | A1 | 8/2006 | O'Neill et al. |
| 2007/0184634 | A1 | 8/2007 | Suzuki et al. |
| 2008/0057414 | A1 | 3/2008 | Han |
| 2010/0248449 | A1 | 9/2010 | Hildreth et al. |
| 2012/0003841 | A1 | 1/2012 | Chikaki et al. |
| 2013/0052826 | A1 | 2/2013 | Nepomnishy et al. |
| 2013/0161792 | A1 | 6/2013 | Tran et al. |
| 2014/0183694 | A1 * | 7/2014 | Gardner .................. H01L 28/90 257/532 |
| 2015/0261212 | A1 | 9/2015 | Takenaga et al. |
| 2015/0376789 | A1 | 12/2015 | Motoyama et al. |
| 2016/0181121 | A1 | 6/2016 | Weisse et al. |
| 2016/0233176 | A1 | 8/2016 | Kato |
| 2016/0356901 | A1 | 12/2016 | Shao et al. |
| 2017/0084452 | A1 | 3/2017 | Yang et al. |
| 2017/0213845 | A1 | 7/2017 | Baba |
| 2017/0243751 | A1 | 8/2017 | Li et al. |
| 2018/0005959 | A1 | 1/2018 | Wang et al. |
| 2018/0323155 | A1 | 11/2018 | Wang et al. |
| 2019/0074349 | A1 | 3/2019 | Lin et al. |

FOREIGN PATENT DOCUMENTS

| | | | |
|---|---|---|---|
| JP | 2000-100675 | A | 4/2000 |
| JP | 2001-332462 | A | 11/2001 |
| JP | 2005-340597 | A | 12/2005 |
| JP | 2006-313887 | A | 11/2006 |
| JP | 2012-35578 | A | 2/2012 |
| JP | 2014-11431 | A | 1/2014 |
| JP | 2015-176903 | A | 10/2015 |
| JP | 2016-58647 | | 4/2016 |
| JP | 2016-146429 | A | 8/2016 |
| JP | 2017-22233 | A | 1/2017 |
| JP | 2017-135238 | A | 8/2017 |
| JP | 2017-201660 | | 11/2017 |
| KR | 10-2015-0131446 | A | 11/2015 |
| TW | 200629412 | | 8/2006 |
| TW | 200737323 | | 10/2007 |
| TW | 201113948 | A1 | 4/2011 |
| WO | WO2010/114887 | A1 | 10/2010 |
| WO | WO2015/012874 | A1 | 1/2015 |
| WO | WO 2018/172873 | A1 | 9/2019 |

* cited by examiner

SEMICONDUCTOR WAFER AND METHOD OF MANUFACTURING SEMICONDUCTOR APPARATUS

CROSS-REFERENCE TO RELATED APPLICATION

This application is a continuation of prior International Application No. PCT/JP2020/010406, filed on Mar. 10, 2020 which is based upon and claims the benefit of priority from Japanese Patent Application No. 2019-0528676 filed on Mar. 20, 2019; the entire contents of all of which are incorporated herein by reference.

FIELD

Embodiments relate to a semiconductor wafer and a method of manufacturing a semiconductor apparatus.

BACKGROUND

The manufacture of a semiconductor device may use Non Product Wafer (NPW) with no semiconductor device formed thereon. Further, known examples of a semiconductor device include memory cells three-dimensionally arranged on a semiconductor wafer.

DETAILED DESCRIPTION

Figure 1:
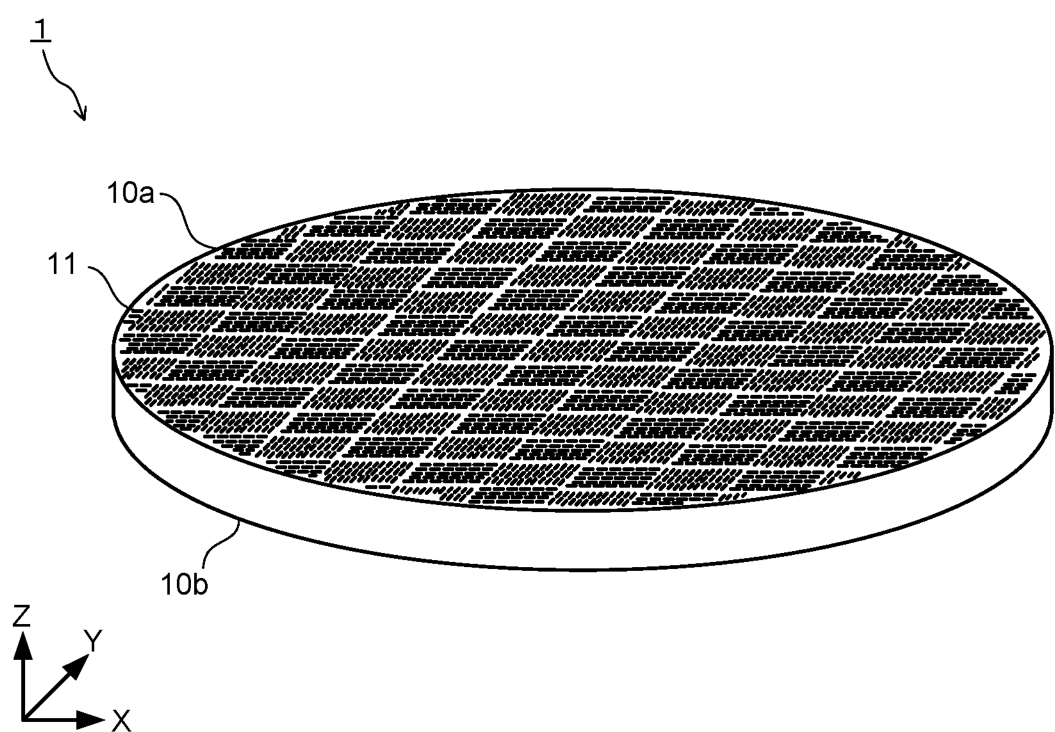
FIG. 1 is a schematic view of an external appearance of a semiconductor wafer.

The semiconductor wafer of the embodiment includes a surface having at least one recess including an inner wall surface. The inner wall surface of the recess is exposed.

Embodiments will be hereinafter explained with reference to the drawings. The relation between the thickness and the planer dimension of each constituent element, a thickness ratio among the constituent elements, and so on illustrated in the drawings may be different from actual ones. Further, in the embodiments, substantially the same constituent elements are denoted by the same reference signs, and an explanation thereof will be appropriately omitted.

(Structural example of a semiconductor wafer)

Figure 2:
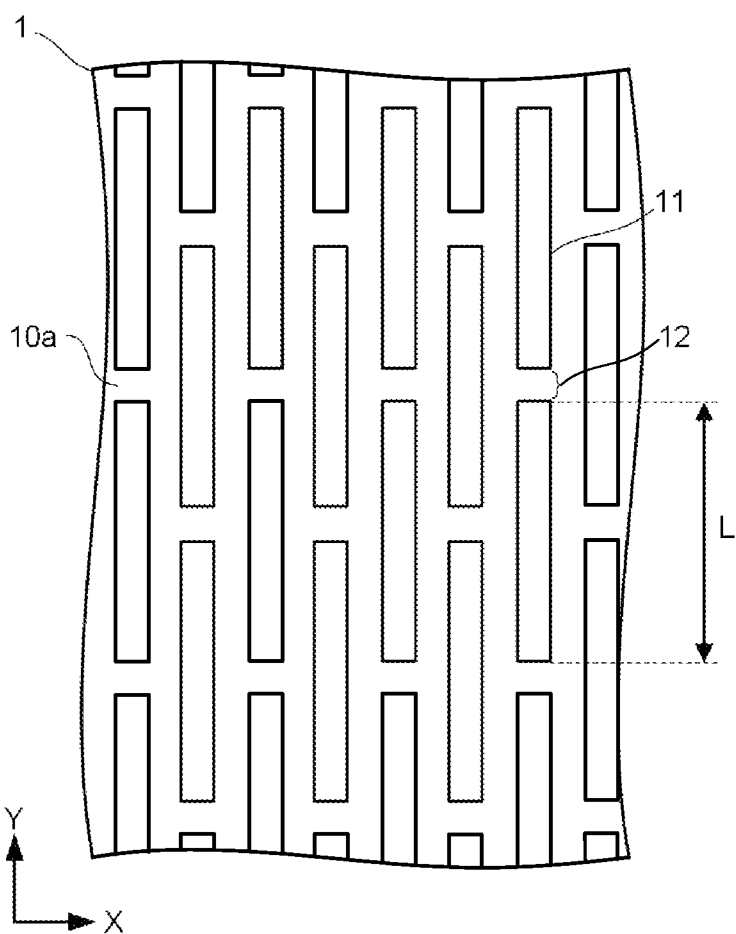
FIG. 2 is a schematic upper view illustrating a structural example of the semiconductor wafer.
Figure 3:
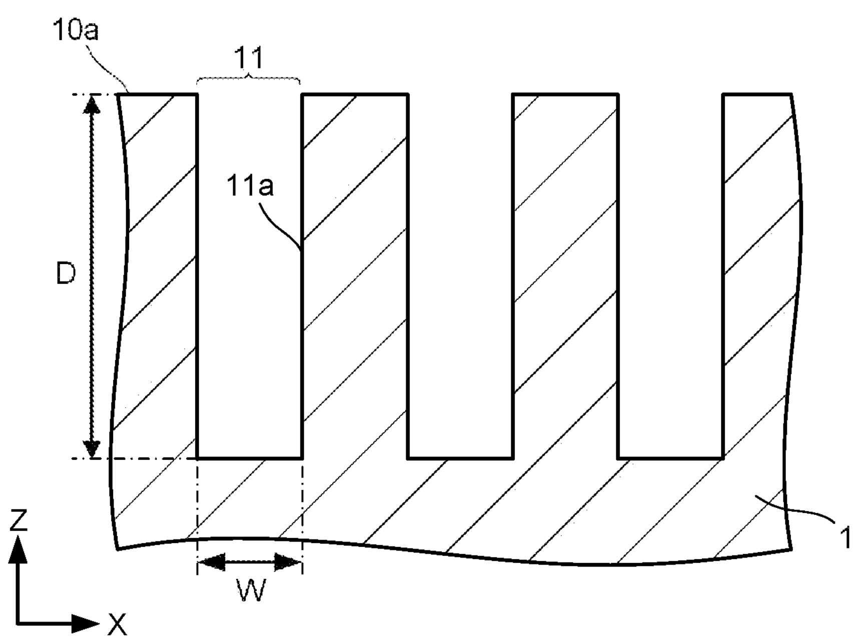
FIG. 3 is a schematic sectional view illustrating the structural example of the semiconductor wafer.

FIG. 1 is a schematic view of an external appearance of a semiconductor wafer, and FIG. 2 is a schematic upper view illustrating a structural example of the semiconductor wafer, illustrating a part of an X-Y plane including an X-axis of the semiconductor wafer and a Y-axis perpendicular to the X-axis. FIG. 3 is a schematic sectional view illustrating the structural example of the semiconductor wafer, illustrating a part of an X-Z section including the X-axis and a Z-axis perpendicular to the X-axis and the Y-axis.

A semiconductor wafer 1 is an NPW, and is used for previously evaluating and measuring film formation, etching, and other various processes in semiconductor manufacture. For example, the semiconductor wafer 1 is used for evaluating and measuring a film formation process such as chemical vapor deposition (CVD) in which a source gas is made to react with a wafer surface to form a thin film or atomic layer deposition (ALD), and an etching process such as chemical dry etching (CDE) in which plasma is supplied to a wafer surface to perform etching on a thin film, atomic layer etching (ALE) in which a source gas is supplied to a surface to perform etching on a thin film, or wet etching in which liquid is supplied. Alternatively, the semiconductor wafer 1 is also used for reproducibility tests for the processes, and the like. Alternatively, the semiconductor wafer 1 may be processed in the chamber together with a wafer having a semiconductor device formed thereon. The semiconductor wafer 1 in the embodiment can also be referred to as a dummy wafer, a test piece, or the like.

The semiconductor wafer 1 includes a surface 10*a* extending in an X-axis direction and a Y-axis direction, and a surface 10*b* being a surface opposite to the surface 10*a*. A surface area of the surface 10*a* is preferably about the same as a surface area of a device formation surface of a semiconductor wafer with a semiconductor device formed thereon or in the middle of the formation of a semiconductor device. Examples of the semiconductor wafer 1 include a silicon wafer, a silicon carbide wafer, a glass wafer, a quartz wafer, a sapphire wafer, a compound semiconductor wafer such as a GaAs substrate, and the like. A shape of the semiconductor wafer 1 is not limited to the shape illustrated in FIG. 1, and it may be, for example, a shape having an orientation flat.

The surface 10*a* has a pattern including at least one recess 11. The recess 11 includes an inner wall surface 1 la. The inner wall surface 11*a* is exposed to the surface 10*a*. When a plurality of recesses 11 are provided, the plurality of recesses 11 are juxtaposed along the X-axis direction of the surface 10*a* as illustrated in FIG. 2, and are extended in a line form along the Y-axis direction of the surface 10*a*. A length L of the recess 11 in a long-side direction is, for example, 4

μm or more and is preferably 40 μm or more. An interval between the recesses 11 adjacent along the X-axis direction is, for example, 0.4 μm or more and 14 μm or less and is preferably 1 μm or less. End portions of the recesses 11 adjacent along the X-axis direction may be displaced from each other along the Y-axis direction.

An aspect ratio of the recess 11 is, for example, 50 or more and 1750 or less. The aspect ratio is defined by a ratio of a depth D of the recess 11 to a width W of the recess 11 illustrated in FIG. 3. The width W of the recess 11 is, for example, 0.4 μm or more and 14 μm or less. The depth D of the recess 11 is, for example, 20 μm or more and a thickness of the semiconductor wafer 1 or less, and the recess 11 may penetrate the semiconductor wafer 1. A surface area of the surface 10*a* is, for example, 50 times or more and preferably 100 times or more a surface area in a case where the recess 11 is not formed. In other words, when the recess or the like is not formed in the surface 10*b*, the surface area of the surface 10*a* is 50 times or more and preferably 100 times or more a surface area of the surface 10*b*.

Examples of the recess 11 preferably has a depth D from the surface 10*a* of 20 μm or more and an aspect ratio of 50 or more. This increases the surface area of the surface 10*a*, and to form the recess 11 with which a film to be formed on the surface 10*a* is easily removed.

The recess 11 may also be formed via a partition 12. When the length L, the depth D, and the aspect ratio of the recess 11 become large, the recess 11 become more likely to collapse to deform. In contrast to this, the partition 12 functions as a beam and thereby enables to support the recess 11, thus prevent the deformation of the recess 11.

In order to prevent the deformation of the recess 11, the partition 12 is preferably provided, for example, at intervals of 100 μm or more in the Y-axis direction. Further, lengths of a plurality of partitions 12 in the Y-axis direction are preferably the same. Positions of the partitions 12 between the recesses 11 adjacent in the X-axis direction may be displaced from each other along the Y-axis direction and regions between the adjacent recesses 11 are connected via the partition 12 as illustrated in FIG. 2.

Figure 4:
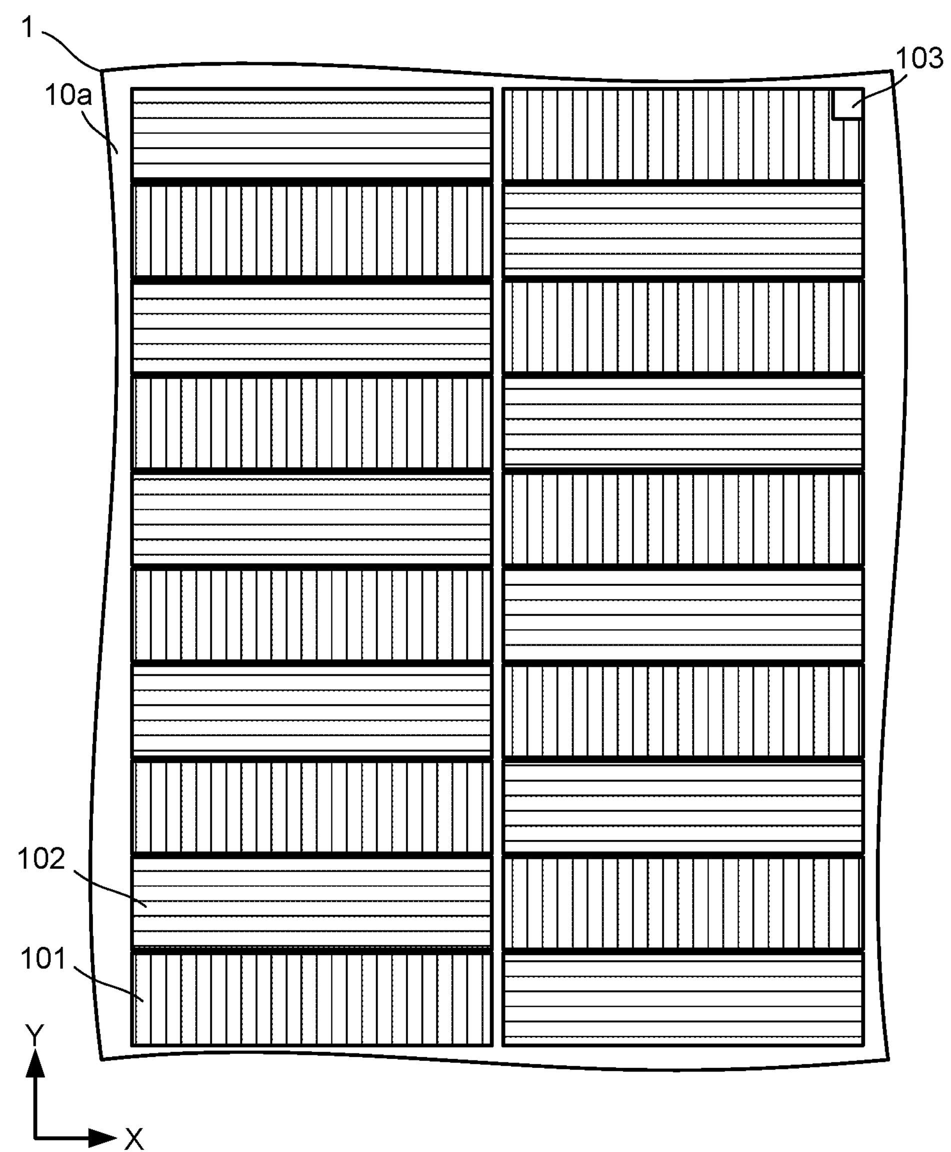
FIG. 4 is a schematic upper view illustrating a structural example of a semiconductor wafer.

The recess 11 may also include a plurality of recesses which extend along mutually different directions. FIG. 4 is a schematic upper view illustrating a structural example of the semiconductor wafer 1, illustrating a part of the X-Y plane. The surface 10*a* of the semiconductor wafer 1 illustrated in FIG. 4 includes a region 101 and a region 102. The region 101 and the region 102 are alternately arranged, for example, along the X-axis direction and the Y-axis direction. An interval between the region 101 and the region 102 is, for example, 2 μm or more. FIG. 4 illustrates one shot region of a plurality of shot regions formed on the surface 10*a*.

Figure 5:
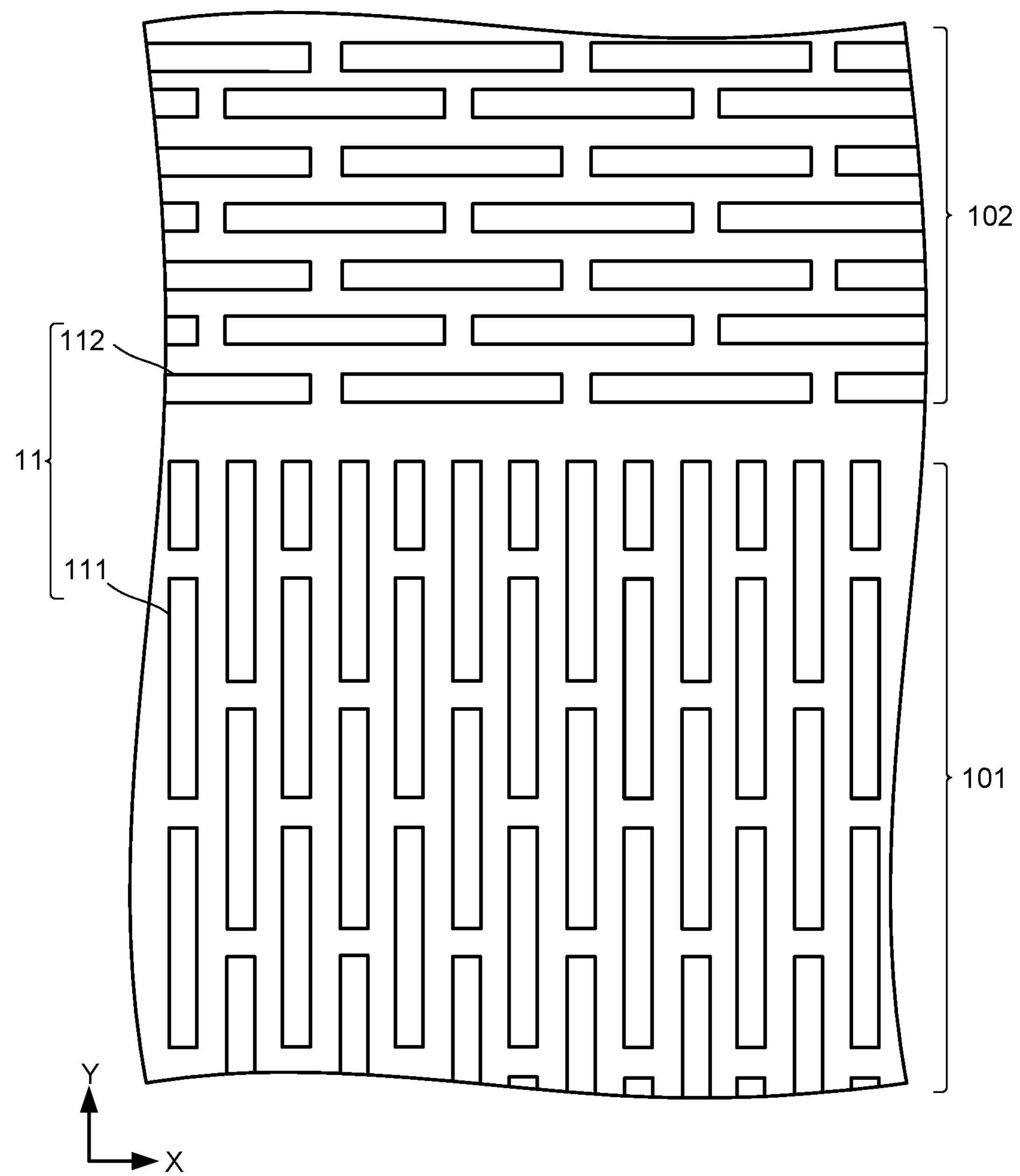
FIG. 5 is a schematic upper view illustrating an intermediate region between a region 101 and a region 102.

FIG. 5 is a schematic upper view illustrating an intermediate region between the region 101 and the region 102. The region 101 has a recess 111, and the region 102 has a recess 112. A plurality of recesses 111 are juxtaposed along the X-axis direction, and extended along the Y-axis direction. A plurality of plural recesses 112 are juxtaposed along the Y-axis direction, and extended along the X-axis direction. The extending direction (the length L direction) of the recess 111 and the extending direction (the length L direction) of the recess 112 are not limited to directions perpendicular to each other, but only have to be directions intersecting with each other. The recess 111 and the recess 112 are included in the recess 11. Therefore, for the other explanation of the recess 111 and the recess 112, the explanation of the recess 11 can be appropriately cited. The structure of the surface 10*a* explained above may also be formed on the surface 10*b*.

As explained above, the semiconductor wafer 1 can be used as a test piece on which a film is formed and evaluation is performed thereon. Alternatively, the semiconductor wafer 1 can also be used as a test piece on which a film is formed, etching is then performed, and evaluation is performed thereon. In this case, the semiconductor wafer 1 is likely to warp since it has a pair of surfaces with different surface areas and a large difference in amount of film formation on the pair of surfaces. Accordingly, if all of the plurality of recesses 11 extend in the same direction, a stress is applied in one direction, resulting in that the warpage of the semiconductor wafer 1 is likely to be increased. In contrast to this, the plurality of recesses 11 extending in the plurality of directions can disperse the directions in which the stress is applied, resulting in prevention of the warpage of the semiconductor wafer 1.

The semiconductor wafer 1 can be repeatedly used as the test piece. Specifically, it is also possible to continuously perform film formation steps on the semiconductor wafer 1, or continuously perform a film formation step and an etching step on the semiconductor wafer 1. The recess 11 increases the surface area to prevent the change in surface area even when the films are continuously formed, resulting in easily removing the film even when the etching.

The surface 10*a* may further have a region 103 as illustrated in FIG. 4. The region 103 is preferably a flat surface having no recess 11. The presence of the flat surface in the region 103 enables to measure a thickness, a density, and a composition of a film to be formed on the surface 10*a* with a measuring device such as a spectral ellipsometer, an X-ray photoelectron spectroscopy (XPS), a fluorescent X-ray analysis, or a Fourier transform infrared spectrophotometer (FTIR), each measuring device having a minimum measurement region larger than a flat part between the recesses 11. An area of the region 103 may be smaller than, for example, an area of the region 101 or an area of the region 102. The region 103 is formed, for example, for each of the plurality of shot regions of the surface 10*a*.

As explained above, the strong recess 11 can be formed by controlling the shape of the recess for increasing the surface area of the semiconductor wafer 1. This recess prevents the change in surface area after repeatedly using the semiconductor wafer 1. This recess leads to provide a semiconductor wafer having a larger surface area. The dimension of the recess 11 explained above is preferably set according to the kind and the thickness of the film to be formed.

(A Method Example of Manufacturing the Semiconductor Wafer)

Examples of the semiconductor wafer 1 can be manufactured using metal-assisted chemical etching (MACE). The MACE is a technique of immersing a substrate having a catalyst layer formed on a surface thereof in a chemical solution to thereby almost vertically etch only a region in contact with the catalyst layer.

Figure 6:
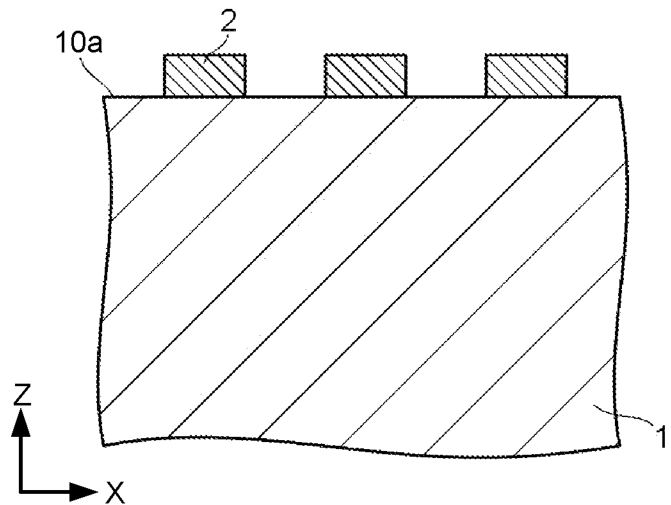
FIG. 6 is a schematic view for explaining a method example of manufacturing a semiconductor wafer.
Figure 7:
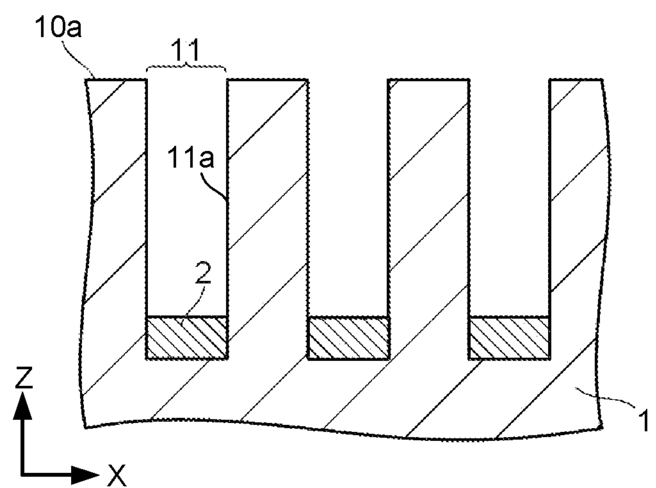
FIG. 7 is a schematic view for explaining the method example of manufacturing the semiconductor wafer.
Figure 8:
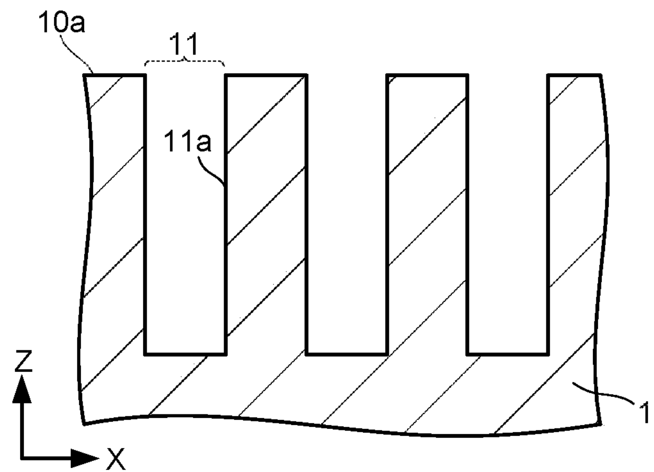
FIG. 8 is a schematic view for explaining the method example of manufacturing the semiconductor wafer.

FIG. 6 to FIG. 8 are views for explaining a method example of manufacturing a semiconductor wafer. The method example of manufacturing the semiconductor wafer includes a catalyst layer formation step, an etching step, and a catalyst layer removal step.

In the catalyst layer formation step, a catalyst layer 2 is formed on the surface 10*a* of the semiconductor wafer 1 as illustrated in FIG. 6. The catalyst layer 2 contains a catalyst of noble metal such as, for example, gold, silver, platinum, iridium, or palladium. The catalyst layer 2 can be formed by using, for example, sputtering, a CVD method, a plating method, or the like. The catalyst layer 2 may contain a catalyst of a carbon material such as graphene.

In the etching step, the semiconductor wafer 1 is immersed in a first chemical solution (etching solution) as illustrated in FIG. 7. Examples of the first chemical solution include a mixed solution of hydrofluoric acid and a hydrogen peroxide solution.

When the semiconductor wafer 1 is immersed in the first chemical solution, a material such as silicon of the surface 10*a* is dissolved in the etching solution, at a contact portion between the surface 10*a* and the catalyst layer 2. When this reaction repeatedly occurs, the semiconductor wafer 1 is almost vertically etched. Thereby, the recess 11 can be formed. The shape of the recess 11 is controlled by adjusting, for example, the size of the catalyst layer 2, the etching time, or the like.

In the catalyst layer removal step, the catalyst layer 2 is removed from the surface 10*a* as illustrated in FIG. 8. The catalyst layer 2 is removed, for example, by impregnating the semiconductor wafer 1 with a second chemical solution. As the second chemical solution, for example, a mixed solution (aqua regia) of hydrochloric acid and nitric acid can be used.

The use of the MACE in the manufacture of the semiconductor wafer 1, enables to easily form the recess 11 even when the recess 11 having a large length L, a large depth D, and a large aspect ratio.

Figure 9:
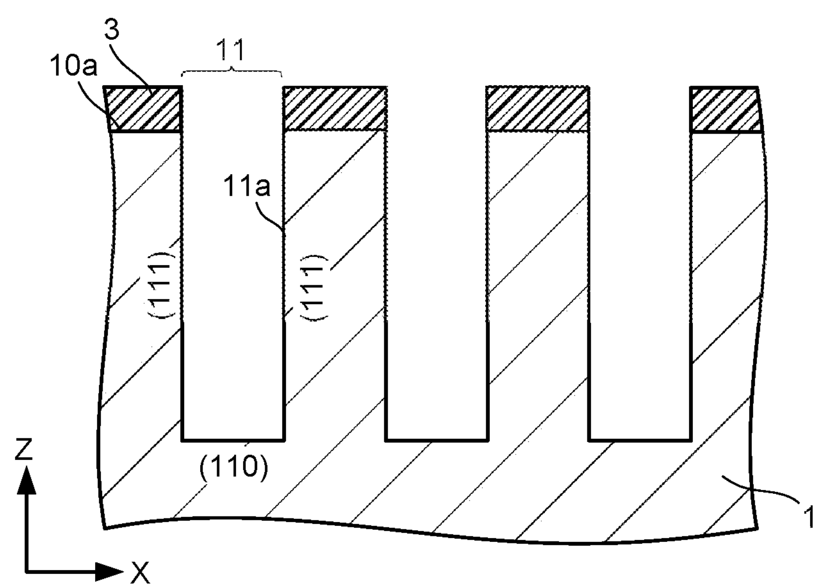
FIG. 9 is a schematic view for explaining another method example of manufacturing the semiconductor wafer.

(Another method example of of manufacturing the semiconductor wafer) FIG. 9 is a view for explaining another method example of manufacturing the semiconductor wafer 1. This example includes forming the surface 10*a* along the (110) plane of the semiconductor wafer 1, forming a mask layer 3 on the surface 10*a*, and etching the semiconductor wafer 1 along the (111) plane of the semiconductor wafer 1 to form the recess 11.

The (111) plane of the semiconductor wafer 1 such as a silicon wafer is more stable than the (110) plane. Therefore, the semiconductor wafer 1 can be almost vertically etched along the (111) plane by alkaline etching using, for example, an alkaline chemical solution. This enables to easily form the recess 11 even though the recess 11 has large length L, depth D, and aspect ratio.

(Another Structural Example of the Semiconductor Wafer)

FIG. 10 to FIG. 14 are schematic sectional views illustrating another structural example of the semiconductor wafer 1. For the same portion as the explanation for the above semiconductor wafer 1, the above explanation can be appropriately cited.

Figure 10:
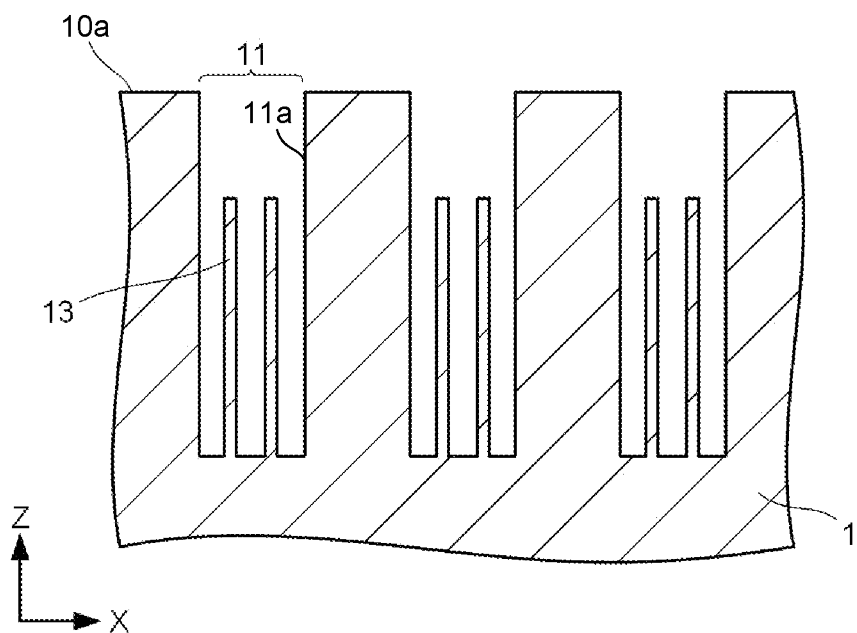
FIG. 10 is a schematic sectional view illustrating another structural example of the semiconductor wafer.

The surface 10*a* of the semiconductor wafer 1 illustrated in FIG. 10 further has a protrusion 13 formed at a bottom portion of the recess 11. The protrusion 13 is provided in the recess 11 and extends in the Z-axis direction, for example, from the bottom surface of the recess 11. The protrusion 13 is, for example, needle-shaped. The protrusion 13 is formed, for example, by forming a through hole along the Z-axis direction in the catalyst layer 2 and then etching the semiconductor wafer 1. The formation of the through hole in the catalyst layer 2 facilitates etching of a region facing an opening of a contact portion between the surface 10*a* and the catalyst layer 2. On the other hand, a region not facing the surface 10*a* and the opening is unlikely to be etched and therefore remains to form the needle-shaped protrusion 13. The formation of the protrusion 13 can further increase the surface area of the surface 10*a*.

Figure 11:
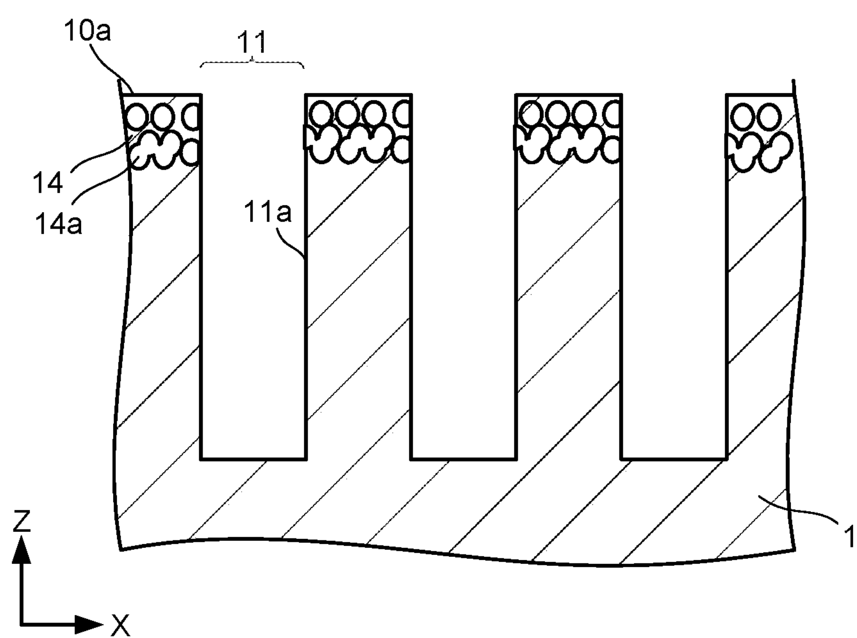
FIG. 11 is a schematic sectional view illustrating another structural example of the semiconductor wafer.

The surface 10*a* of the semiconductor wafer 1 illustrated in FIG. 11 further has a porous region 14. The porous region 14 is formed, for example, by etching an intermediate region between adjacent recesses 11 in the semiconductor wafer 1 with a first chemical solution or a second chemical solution.

The formation of the porous region 14 can further increase the surface area of the surface 10*a*.

Figure 12:
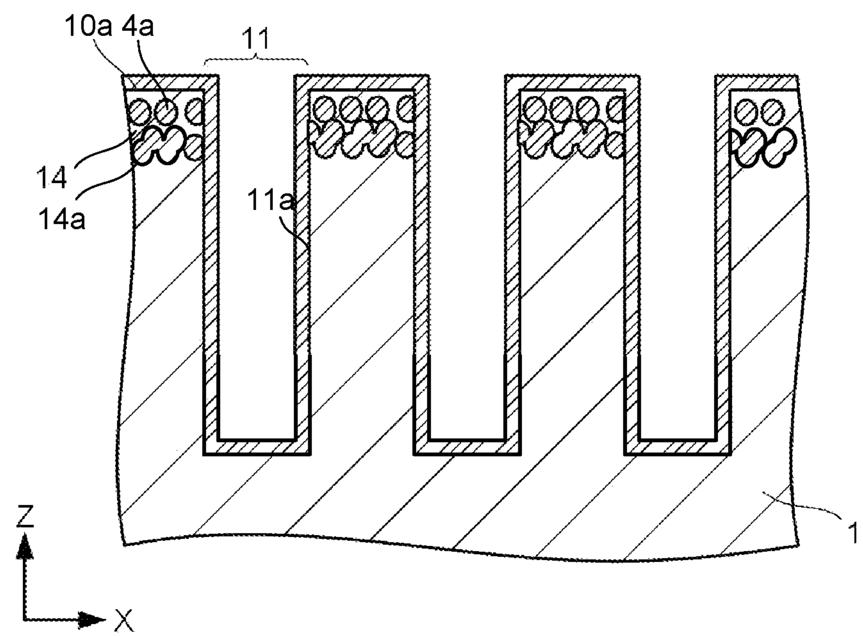
FIG. 12 is a schematic sectional view illustrating another structural example of the semiconductor wafer.
Figure 13:
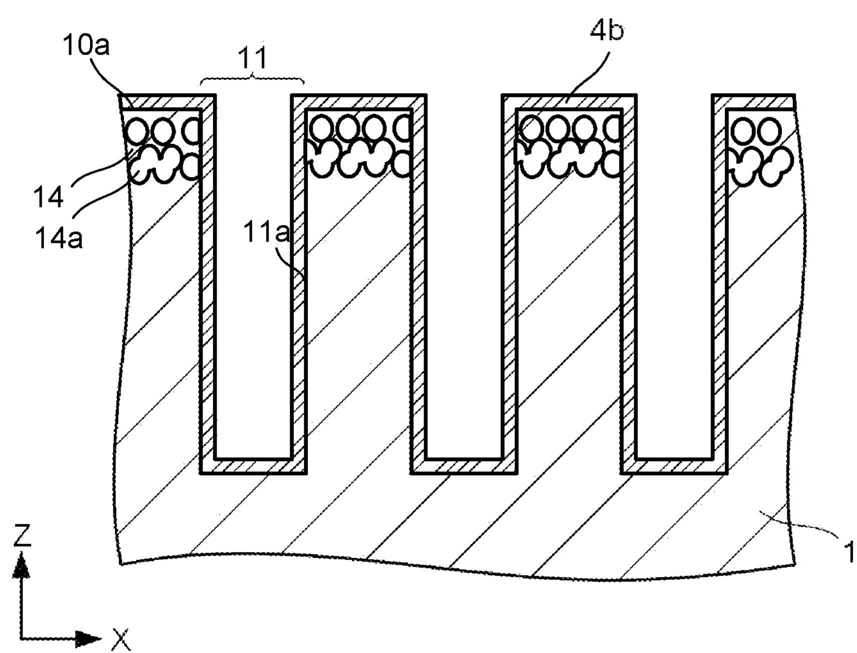
FIG. 13 is a schematic sectional view illustrating another structural example of the semiconductor wafer.

As illustrated in FIG. 12, a vacancy 14*a* in the porous region 14 may be closed by filling the vacancy in the porous region 14 with a filler 4*a*. A protective film 4*b* may be formed over the entire surface 10*a* including the porous region 14 as illustrated in FIG. 13. Thus, the semiconductor wafer 1 is repeatedly used and thereby can prevent further etching of the porous region 14. As the filler 4*a* and the protective film 4*b*, for example, a material having heat resistance and chemical resistance such as carbon, silicon, silicon nitride, or silicon oxide, and silicon carbide or silicon carbonitride is more preferable.

Figure 14:
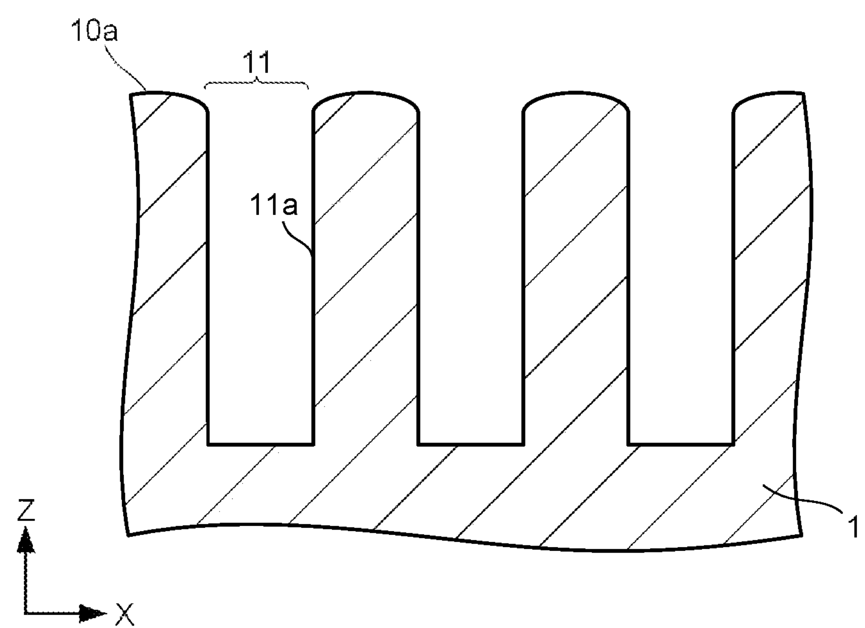
FIG. 14 is a schematic sectional view illustrating another structural example of the semiconductor wafer.

The vacancy 14*a* in the porous region 14 may be closed by dissolving the porous region 14 by annealing under a hydrogen atmosphere. The surface 10*a* after the dissolution has a curved surface as illustrated in FIG. 14. The dissolution of the porous region 14 can prevent the porous region 14 from being etched.

(Structural Example of a Semiconductor Apparatus)

Figure 15:
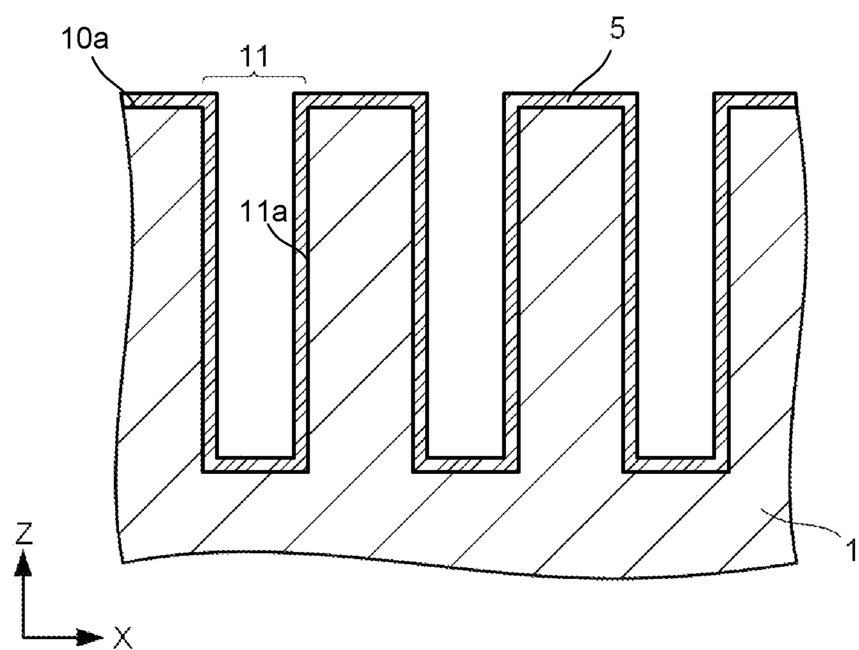
FIG. 15 is a schematic sectional view illustrating a structural example of a semiconductor apparatus.

FIG. 15 is a schematic sectional view illustrating a structural example of a semiconductor apparatus using the semiconductor wafer 1. The semiconductor apparatus illustrated in FIG. 15 includes a film 5 provided on the semiconductor wafer 1. The film 5 is formed on the surface 10*a*, for example, using a film-forming apparatus such as a CVD apparatus or the like. The film 5 functions, for example, as a base film for evaluating the film formation, such as an etching object film to be etched. The thickness of the film 5 is set according to the usage. The film 5 may be a stacked film and may be formed on the protective film 4*b* illustrated in FIG. 13.

(Usage Example of a Semiconductor Wafer)

As a usage example of a semiconductor wafer in an embodiment, an example of using the above-explained semiconductor wafer 1 as a dummy wafer in a manufacturing step of a semiconductor apparatus will be explained using FIG. 16 to FIG. 19.

Figure 16:
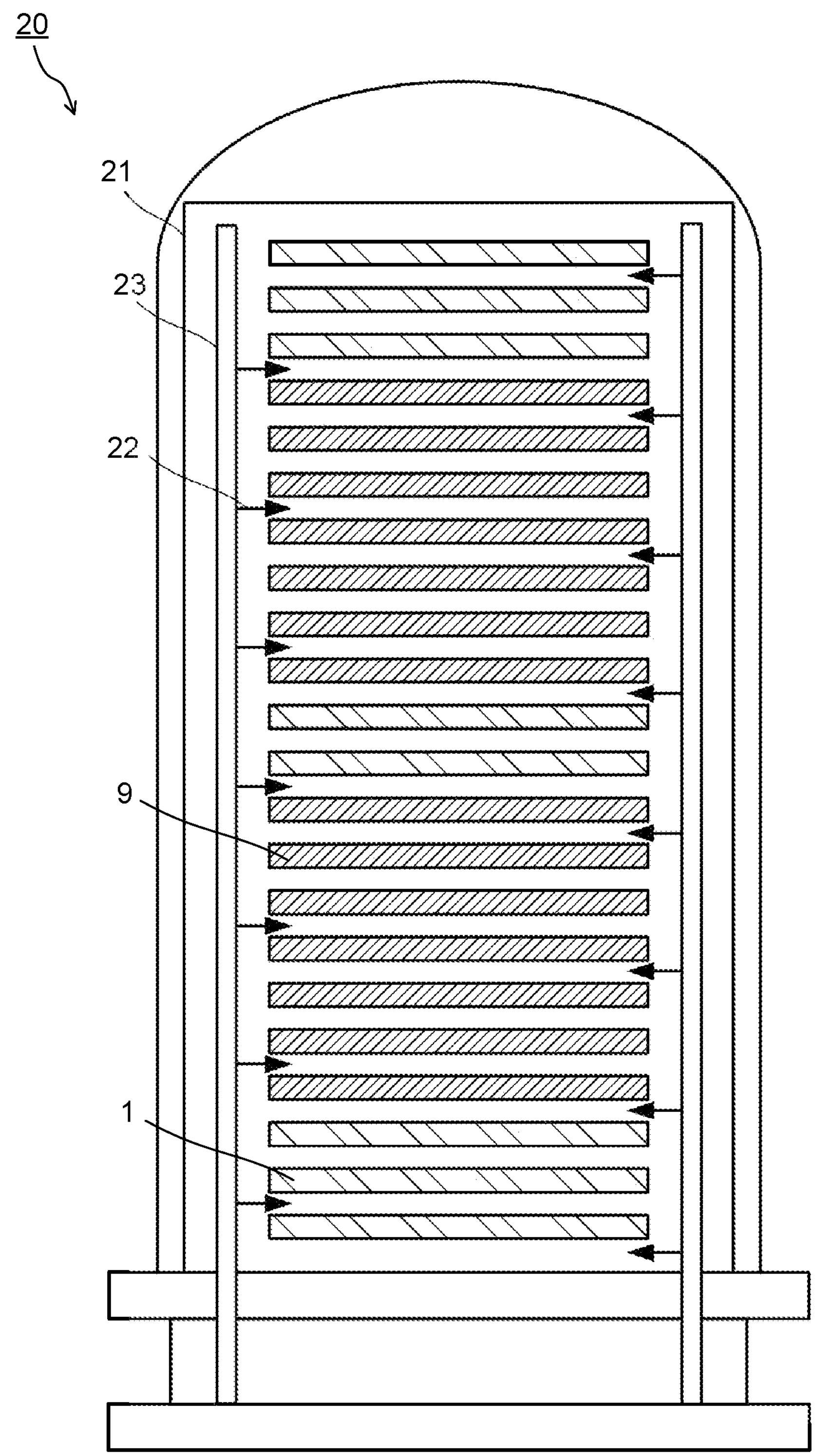
FIG. 16 is a schematic view illustrating a configuration example of a semiconductor manufacturing apparatus.

FIG. 16 is a schematic view illustrating a configuration example of a semiconductor manufacturing apparatus. FIG. 16 illustrates a configuration example of LP-CVD (Low Pressure Chemical Vapor Deposition) apparatus. A semiconductor manufacturing apparatus 20 illustrated in FIG. 16 includes a chamber 21, and a pipe 23 for supplying a source gas 22 into the chamber 21. The semiconductor manufacturing apparatus 20 further includes a vacuum pump, a heater, an exhaust system, a power source, a control circuit, and so on which are not illustrated.

The semiconductor wafer 1 as a dummy wafer may be conveyed together with a device wafer 9 into the same chamber 21 to be simultaneously processed with the device wafer 9, the device wafer 9 being a semiconductor wafer with a semiconductor device formed thereon or in the middle of the formation of a semiconductor device. A method example of manufacturing the semiconductor apparatus in this case includes placing the device wafer 9 into the chamber 21, placing the semiconductor wafer 1 of the embodiment into the chamber 21, and simultaneously processing the device wafer 9 and the semiconductor wafer 1 in the chamber 21. The device wafer 9 and the semiconductor wafer 1 are placed into the chamber 21 at the same step or different steps.

FIG. 16 illustrates an example in which, when a plurality of device wafers 9 are processed in the chamber 21, at least one semiconductor wafer 1 is placed together with the plurality of device wafers 9 in the chamber 21, and the wafers are simultaneously subjected to film formation processing. Although at least one or more semiconductor wafers 1 only have to be placed, it is preferable to place a plurality of the semiconductor wafers 1 as illustrated in FIG. 16. Further, the semiconductor wafer 1 is preferably arranged in at least an upper region or a lower region in the chamber 21 as illustrated in FIG. 16.

Here, a structural example of the device wafer 9 will be explained. A semiconductor device to be formed on the device wafer 9 is, for example, a three-dimensional NAND-type flash memory. Hereinafter, a film formation step in a method of manufacturing the three-dimensional NAND-type flash memory will be explained.

Figure 17:
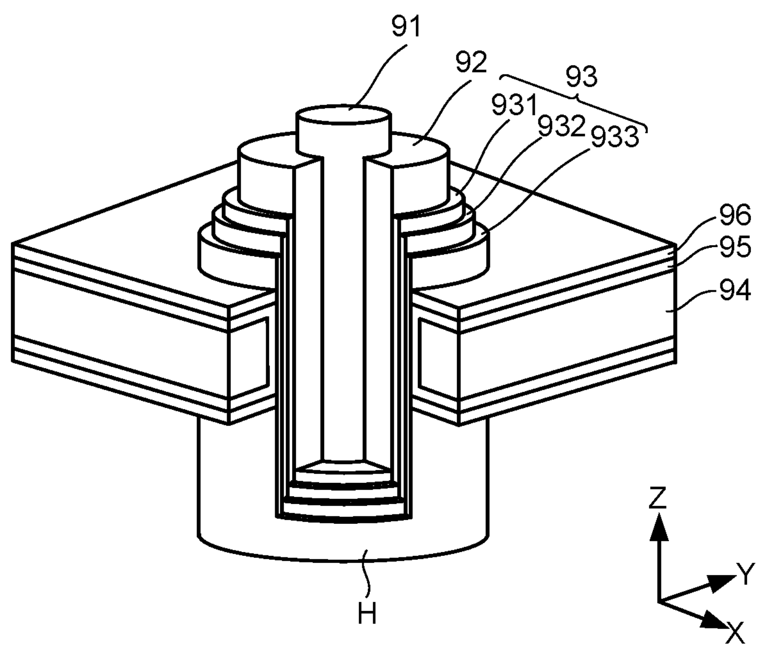
FIG. 17 is a schematic view illustrating a structural example of a semiconductor device.

FIG. 17 is a schematic view illustrating a structural example of a semiconductor device. The semiconductor device illustrated in FIG. 17 includes a core insulating film 91, a semiconductor channel layer 92, a memory film 93 including a tunnel insulating film 931, a charge storage layer 932, and a block insulating film 933, an electrode material layer 94, a metal layer 95, and an insulation layer 96. The electrode material layer 94 functions as a gate electrode (word line). The core insulator 91, the semiconductor channel layer 92, and the memory film 93 are formed in a memory hole H, and constitute a memory cell. The block insulating film 933 is, for example, a $SiO_2$ film (silicon oxide film). The charge storage layer 932 is, for example, a SiN film (silicon nitride film). The tunnel insulating film 931 is a stacked film including, for example, a $SiO_2$ film and a SiON film (silicon oxynitride film). The semiconductor channel layer 92 is, for example, a polysilicon layer. The core insulator 91 is, for example, a $SiO_2$ film. The electrode material layer 94, the metal layer 95, and the insulation layer 96 are, for example, a W layer (tungsten layer), a TiN film (titanium nitride film), and an $Al_2O_3$ film (aluminum oxide film), respectively. In this case, the metal layer 95 functions as a barrier metal layer in the above-explained electrode layer, and the insulation layer 96 functions as a block insulating film together with the above-explained block insulating film 933.

Figure 18:
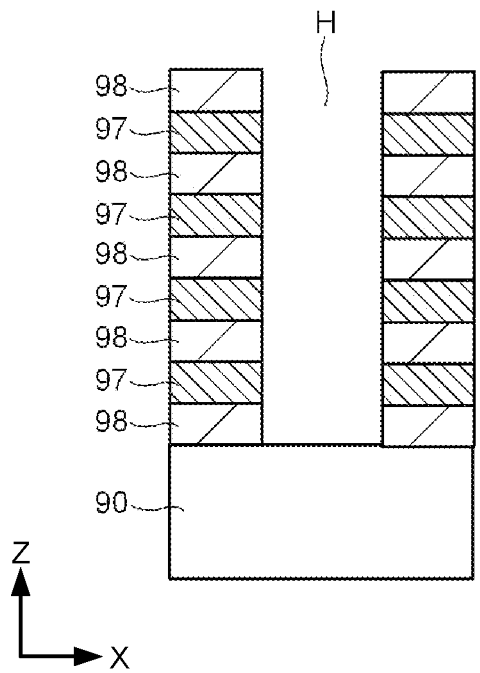
FIG. 18 is a schematic view for explaining a method example of manufacturing the semiconductor device.

Next, a method example of manufacturing the semiconductor device illustrated in FIG. 17 will be explained using FIG. 18 and FIG. 19. In FIG. 18, a stacked film in which a plurality of sacrificial layers 97 and a plurality of insulation layers 98 are alternately stacked is formed on a semiconductor wafer 90 such as a silicon wafer, and a memory hole H being a recess is provided in these sacrificial layers 97 and insulation layers 98. The sacrificial layer 97 is a region where the electrode material layer is to be formed later. The memory hole H is a region where the memory film 93 is to be formed later.

The semiconductor wafer 1 is used for the formation of the memory film 93, the semiconductor channel layer 92, and the core insulator 91, or the formation of the electrode material layer 94, the metal layer 95, and the insulation layer 96, and for the modification treatment and etching process of those thin films including the sacrificial layers 97 and the insulation layers 98 constituting a side surface of the memory hole H, for example, in manufacturing the semiconductor device.

The formation of the memory film 93 is performed by conveying, into the chamber 21, the device wafer 9 in a state where the memory hole H is formed in the stack in which the plurality of sacrificial layers 97 and the plurality of insulation layers 98 are alternately stacked illustrated in FIG. 18 and forming the block insulating film 933, the charge storage layer 932, and the tunnel insulating film 931 in this order in the memory hole H.

Figure 19:
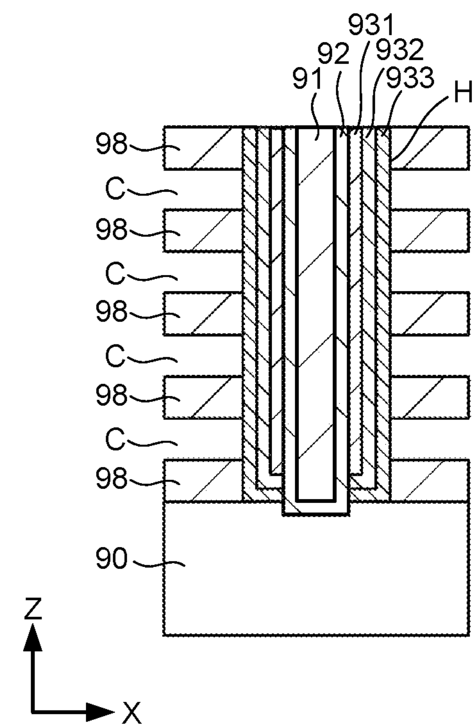
FIG. 19 is a schematic view for explaining the method example of manufacturing the semiconductor device.

The formation of the metal layer 95 and the insulation layer 96 is performed after the formation of the memory film 93, by conveying, into the chamber 21, the device wafer 9 from which the plurality of sacrificial layers have been removed and which thus has cavities C between the plurality of insulation layers 98 and forming the insulation layer 96 and the metal layer 95 in this order in the cavity C as illustrated in FIG. 19 (this is called a replacement step).

The modification treatment includes oxidation caused by performing treatment using gas containing oxygen, nitridation caused by performing gas phase treatment using nitrogen-containing gas such as ammonia, and crystallization caused by performing heat treatment after or in the middle of the formation of respective layers or films in the formation step of, for example, the sacrificial layers 97 and the insulation layers 98, the block insulating film 933, the charge storage layer 932, the tunnel insulating film, and the semiconductor channel layer 92 in FIG. 18 and FIG. 19. Further, the modification treatment includes treatment of forming a sacrificial layer containing a desired impurity such as boron, phosphorus, or metal after the formation of the layer or film, diffusing the impurity in a targeted layer or film by performing heat treatment, and then etching the sacrificial layer to remove it. This also applies to the electrode material layer 94, the metal layer 95, and the insulation layer 96.

The etching process includes a process of reducing a thickness of the layer or film, for example, for each of the sacrificial layers 97 and the insulation layers 98 in FIG. 18, and the formed block insulating film 933, charge storage layer 932, tunnel insulating film, and semiconductor channel layer 92 in FIG. 19 after the formation of the layer or film, by using an etching gas containing halogen such as fluorine, chlorine, or bromine, or the like. The same also applies to the electrode material layer 94, the metal layer 95, and the insulation layer 96.

In each of the examples, at least one semiconductor wafer 1 is conveyed together with the plurality of device wafers 9 into the chamber 21, and subjected to the similar processing. Consequently, when a desired processing result cannot be obtained at a specific position in the chamber 21, the semiconductor wafer 1 can be used as a dummy wafer. Plural processing may be performed.

As explained above, the semiconductor wafer 1 is formed with the plurality of recesses 11 so as to increase its surface area. Accordingly, the semiconductor wafer 1 forms dummy wafer having about the same surface area as that of the device wafer 9. Therefore, it is possible to further reduce a variation in film formation in the chamber 21 caused, for example, by a surface area difference, resulting in that uniformity of the film thickness, the film composition, the film density, and so on between the device wafers 9 or within a plane of the device wafer 9 can be further improved. Specifically, it becomes possible to manufacture a semiconductor device with further improved reliability.

Although the present usage example has been explained by using the LP-CVD apparatus as an example, the semiconductor wafer 1 can also be applied to another semiconductor manufacturing apparatus. Further, the semiconductor device is not limited to the three-dimensional NAND-type flash memory, and it is also possible to apply another semiconductor device.

While certain embodiments of the present invention have been described, these embodiments have been presented by way of example only, and are not intended to limit the scope of the inventions. The novel embodiments described herein may be embodied in a variety of other forms; furthermore, various omissions, substitutions and changes may be made therein without departing from the spirit of the inventions. The accompanying claims and their equivalents are intended to cover such forms or modifications as would fall within the scope and spirit of the inventions.

What is claimed is:

1. A semiconductor wafer, comprising:

a surface having at least one recess including an inner wall surface and a bottom surface, the inner wall surface and the bottom surface being exposed, wherein:

the at least one recess includes a first recess and a second recess;

the first recess extends along a first direction of the surface;

the second recess extends along a second direction intersecting with the first direction on the surface;

each of the first and second recesses is surrounded by the corresponding inner wall surface; and the surface further has a porous region.

2. The semiconductor wafer according to claim 1, wherein the at least one recess has a depth from the surface of 20 μm or more and an aspect ratio of 50 or more.

3. The semiconductor wafer according to claim 1, wherein a surface area of the surface is 50 times or more a surface area of a surface opposite to the surface.

4. The semiconductor wafer according to claim 1, wherein the at least one recess is provided via a partition.

5. The semiconductor wafer according to claim 1, wherein the surface further has a protrusion provided in the at least one recess.

6. The semiconductor wafer according to claim 1, further comprising a film provided on the surface.

7. The semiconductor wafer according to claim 6, wherein the film contains silicon carbide or silicon carbonitride.

8. The semiconductor wafer according to claim 1, wherein the semiconductor wafer is a silicon wafer, a silicon carbide wafer, a glass wafer, a quartz wafer, a sapphire wafer, or a compound semiconductor wafer.

9. The semiconductor wafer according to claim 1, wherein the semiconductor wafer is a silicon wafer.

10. The semiconductor wafer according to claim 1, wherein the semiconductor wafer consists of silicon.

11. The semiconductor wafer according to claim 1, wherein the inner wall surface and the bottom surface are exposed to an air.

* * * * *